(12) United States Patent
Yamamoto et al.

(10) Patent No.: US 6,245,678 B1
(45) Date of Patent: Jun. 12, 2001

(54) METHOD FOR MANUFACTURING SEMICONDUCTOR WAFERS

(75) Inventors: Hiroaki Yamamoto; Akihiro Ishii, both of Kiyotake-cho (JP)

(73) Assignee: Komatsu Electronic Metals Co., Ltd., Hiratsuku (JP)

( * ) Notice: Subject to any disclaimer, the term of this patent is extended or adjusted under 35 U.S.C. 154(b) by 0 days.

(21) Appl. No.: 09/226,111

(22) Filed: Jan. 7, 1999

(30) Foreign Application Priority Data

Jan. 9, 1998 (JP) .................................................. 10-002722

(51) Int. Cl.⁷ ........................ H01L 21/302; H01L 21/461
(52) U.S. Cl. ........................... 438/692; 438/689; 438/691; 438/748; 438/753; 216/92
(58) Field of Search ..................................... 438/689, 691, 438/692, 748, 753; 216/92

(56) References Cited

U.S. PATENT DOCUMENTS 5,800,725 * 9/1998 Kato et al. .............................. 216/88
6,043,156 * 3/2000 Kai et al. .............................. 438/692

* cited by examiner

*Primary Examiner*—John F. Niebling
*Assistant Examiner*—David A. Zarneke
(74) *Attorney, Agent, or Firm*—Oliff & Berridge, PLC

(57) ABSTRACT

A Bernoulli type chucking device 2 supports the rear surface 12 of a semiconductor wafer 1. The etchant 30 turns around and reaches the portion beneath the beveled portion 13 of the semiconductor wafers 1. However, the etchant is restrained on the beveled portion by a gas flow coming from the openings 22A of the gas-expelling passages 22 in the centrifugal direction. The gas belows off the etchant, which has turned around and is going to reach the rear surface. Thus, the beveled portion 13 is mirror-finished when etching of the semiconductor wafer front surface 11 is carried out, and mirror-finishing of part of the rear surface 12 can be avoided. Furthermore, mirror-finishing can be performed without being influenced by the shape of the beveled portions of semiconductor wafers. Compared with conventional method, this invention can perform mirror-finishing more efficiently.

6 Claims, 2 Drawing Sheets

METHOD FOR MANUFACTURING SEMICONDUCTOR WAFERS

BACKGROUND OF THE INVENTION

1. Field of the Invention

The present invention relates to a method for manufacturing a semiconductor wafer, in particular, to a method for mirror-finishing the beveled surfaces located at the peripheral rims of semiconductor wafers.

2. Description of the Related Art

Conventionally, beveling of the peripheral rims of semiconductor wafers has been performed for the purpose of avoiding chipping or breakage during the process of polishing or flattening such as lapping. Recently, high flatness of the beveled peripheral portions is required so as to enhance the yield during device processing. Therefore, it is necessary to finish them by mirror-polishing. The mirror-polishing of the peripheral portions of the semiconductor wafers has been performed by using a polishing unit as follows: A beveling device, in which a grinding wheel is installed, shapes the beveled portions of semiconductor wafers. Then, a polishing unit, whose surface is provided with a polishing pad affixed thereon, is guided to urge against the beveled portions of the semiconductor wafer to be polished. Afterward, mirror-polishing is performed by supplying slurry.

However, to accurately polishing the beveled portions with the aid of the polishing unit, it is essential to analyze the slanted angle of the beveled portion and control the polishing unit based on the analyzed data.

Furthermore, to polish the beveled portion into the shape of a taper, three surfaces have to be polished. Those are thr front-side tapered surface, the outer peripheral surface, and the rear-side tapered surface. The three surfaces have to be polished by separate polishing units and the wafer has to be turned over, therefore processing time is long.

In addition, the boundary portions among the front-side tapered surface, the outer peripheral surface, and the rear-side tapered surface are quite difficult to be mirror-polished. Therefore, there exists a possibility that the boundary portions will remain not mirror-polished.

SUMMARY OF THE INVENTION

In view of the above-described problems, the object of this invention is to provide a method for manufacturing semiconductor wafers, which is capable of precisely performing mirror-finishing without being influenced by the shape of the beveled portions of semiconductor wafers, and can perform mirror-finishing more efficiently compared with conventional methods.

The above object is achieved by employing spin-etching process when the beveled portions formed on the outer peripheries of semiconductor wafers are to be mirror-finished. The mirror-surface treatment of the beveled portions may be performed while carrying out mirror-finishing of the semiconductor wafer surfaces. Namely, the beveled portions formed on the outer peripheries of semiconductor wafers are mirror-finished through spin-etching process at the same time the semiconductor wafer surfaces are spin-etched. Naturally, in case that a beveled portion is mirror-finished solely, an etching-protection film is formed to cover the whole semiconductor wafer except the beveled portion, and the etching-protection film is removed after spin-etching. This can achieve mirror-finishing of the beveled portion solely. Furthermore, if etchant turns around and follows exceeding the beveled portion to reach the rear surface of the semiconductor wafer, part of the rear surface will be mirror-finished. This will bring about irregular color or improper glossiness on the rear surface. To avoid this drawback, gas is guided to radially flow from the rear surface toward the edge of the semiconductor wafer. Therefore, excess etchant can be blown off from the rear surface of the semiconductor wafer.

According to the present invention, the following advantages can be achieved.

(1) Compared with conventional mirror-treatment, which is performed by polishing, of the beveled portions formed on the outer peripheries of semiconductor wafers; the processing time according to this invention is shorter. Furthermore, mirror-finishing of the surfaces and the outer peripheries of semiconductor wafers can be performed simultaneously. Therefore, processing in this invention is very efficient.

(2) Because the spin-etching is employed, the outcome will not be influenced by the shape of the beveled portions formed in the preceding process. Therefore, a mirror-finishing can be performed uniformly. In addition, finishing of the beveled portion boundary which is not surely attained in the conventional mechanical polishing can be definitely performed.

(3) Non-contact processing is used; therefore work-strain layer incurred by mechanical working will not happen.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENTS

Figure 1:
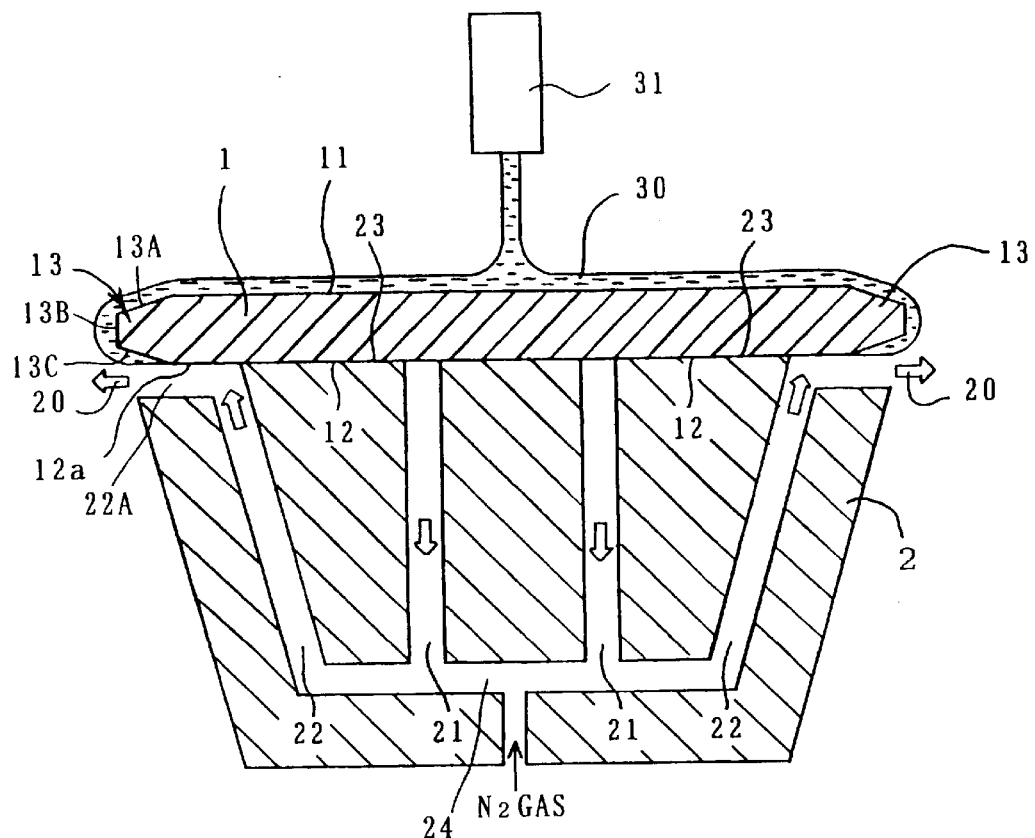
FIG. 1 is a schematic view showing the method for finishing semiconductor wafers, according to Embodiment 1 of the present invention.

According to the present invention, instead of conventional predominant polishing; etching which is non-contact processing, especially spin-etching is used in the process for mirror-finishing the beveled portion formed on the outer periphery of a semiconductor wafer.

Since the etching rate of spin-etching can be controlled, a uniform thickness can be etched off not only from the beveled portion but also from the whole outer periphery of the semiconductor wafer. Furthermore, etchant flows and performs finishing during tracing the outer peripheral surface of the semiconductor wafer. Therefore, the shape of the beveled portion formed in the preceding process will not influence the outcome of the finishing operation.

Furthermore, even if the crossed section is in the shape of a taper, the upper portion, the middle portion, and the lower portion thereof can be etched simultaneously. Thus, the finishing operation according to the present invention is very efficient.

The etchant used in this invention is an acid etchant, which preferably can be a mixture of at least two acids selected from the group of hydrofluoric acid, nitric acid, sulfuric acid, and phosphoric acid; or a mixture of the aqueous solutions thereof.

To perform mirror-finishing of the beveled portion formed on the outer peripheral surface of the semiconductor wafer by spin-etching, it is anticipated that etchant is controlled so as to flow and spill over the whole beveled portion but not reach the rear surface of the semiconductor wafer.

The amount of the etchant supplied and the rotating speed of the semiconductor wafer are the most critical factors for achieving the anticipated result. To achieve the above result, the supporting device in the state of supporting the rear surface of the semiconductor wafer has to be arranged in such a way that the portion contacting with the rear surface will not hinder the etchant to flow on the whole surface of the beveled portion.

Furthermore, when etchant flows on the whole surface of the beveled portion, it is not desirable that the etchant turns around and flows exceeding the beveled portion to reach the rear surface of the semiconductor wafer. Therefore, a measure for controlling the etchant flow, capable of splitting the etchant away from the surface of the semiconductor wafer at the boundary between the beveled portion and the rear surface, should be provided to protect the rear surface of the semiconductor wafer from being etched.

Etching method meeting the above requirements could be, for example, the spin-etching process described in the following embodiments in which Bernoulli type chucking device is employed.

Furthermore, in the process of mirror-finishing the beveled portion solely, first, the front surface of the semiconductor wafer is coated with resist films or oxide films which are used as etching protection films, or is affixed with acidproof seals. Then, spin-etching is performed to mirror-finish the beveled portion. Finally, the etching protection films are removed.

The present invention will be further illustrated by way of preferred embodiments with reference being made to the attached drawings.

EMBODIMENT 1

Figure 2:
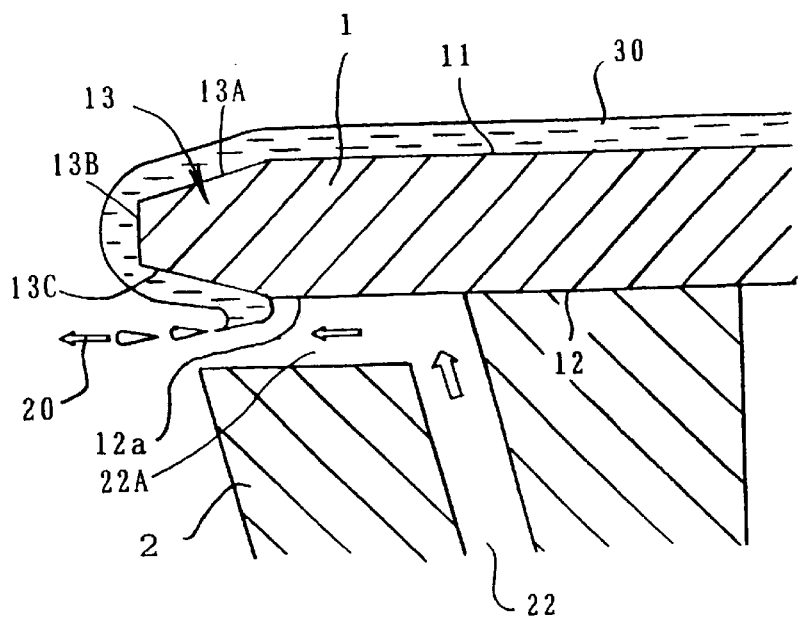
FIG. 2 is a schematic view showing the state of the etchant dwelling on the beveled portion of a semiconductor wafer.

FIG. 1 is a schematic view showing the method for polishing semiconductor wafers, according to Embodiment 1 of this invention. FIG. 2 is a schematic view showing the state of the etchant dwelling on the beveled portion of a semiconductor wafer.

As shown in FIG. 1, in the process of spin-etching a semiconductor wafer 1, the rear surface 12 of the semiconductor wafer is supported by a Bernoulli type chucking device 2. A nozzle 31 disposed above the semiconductor wafer 1 is used for supplying etchant 30.

As shown in FIG. 1, the chucking device 2 disposed on a rotation seat supports the semiconductor wafer 1 and is driven to rotate. Inert gas (nitrogen gas was used in this embodiment) is guided from the inner center of the rotation seat. The inlet passage of the gas is perpendicular to a horizontal main passage 24, and suction ports 21 are disposed near the central portion of the rear surface 12 of the semiconductor wafer 1. The rear surface 12 of the semiconductor wafer 1 is sucked by the injection of the nitrogen gas and is secured on the chucking device 2. The outer peripheral portion 12a, whose width is small (about 10–20 mm), of the suction surface 23 is arranged in a non-contact manner. Namely, the main passage 24 communicates with gas-expelling passages 22 used for expelling gas and extending toward the outer peripheral portion of the suction surface 23 along a slanted path. The openings 22A of the gas-expelling passages 22 are located beneath the outer peripheral portion 12a of the rear surface of the semiconductor wafer 1.

FIG. 2 shows the outer peripheral portion of the semiconductor wafer 1 in the state of being spin-etched. As shown in FIG. 2, the gas 20 expelled through the gas-expelling passages 22 blows toward the semiconductor wafer 1 supported by the chucking device 2 along an upward-slanted path. The gas 20 hits the outer peripheral portion 12a of the rear surface 12 and then turns into the centrifugal direction to escape away.

When the semiconductor wafer 1 is supported and rotated by the chucking device 2, the etchant 30 supplied onto the central portion of the front surface of the semiconductor wafer 1 spreads over the whole front surface of the semiconductor wafer 1. There is a tendency that the etchant 30 spills from the front-surface tapered portion 13a and reaches the rear-surface tapered portion 13c by way of the outer end-surface portion 13b. In other words, the etchant 30 is inclined to turn around at the beveled portion 13 and reach the rear surface of the semiconductor wafer 1. However, the etchant 30 having turned around and reached the boundary between the beveled portion 13 and the rear surface 12 is restrained on the beveled portion 13 by the gas 20 expelled from the gas-expelling passages 22, and excess etchant is blown off toward the outer peripheral portion. Thus, the etchant 30 will not reach the rear surface 12.

According to this embodiment, the front surface 11 and the beveled portion 13 are mirror-finished simultaneously by supplying the etchant 30 onto the front surface 11 of the semiconductor wafer 1. Conventionally, the above mirror-finishing of the front surface 11 and the beveled portion 13 were performed separately. Therefore, in this embodiment, the processing time can be intensely reduced.

EMBODIMENT 2

The process employed in this embodiment shows a method for solely mirror-finishing the outer beveled portion of a semiconductor wafer whose front surface needn't be polished.

Figure 3:
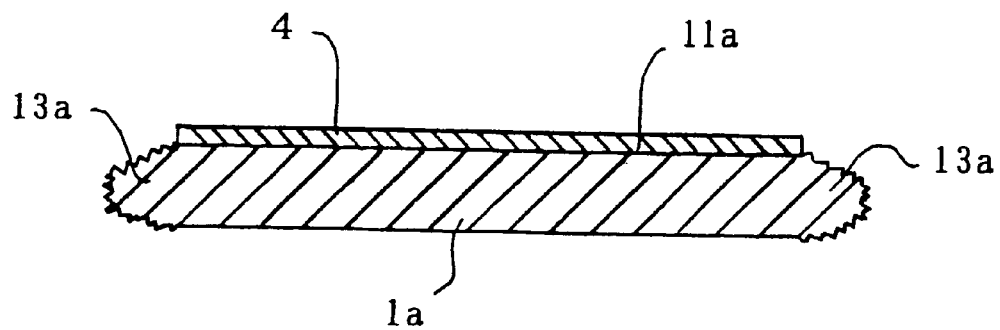
FIGS. 3a, 3b and 3c are crossed-sectional views respectively showing the contours of a semiconductor wafer at different stages.
Figure 3:
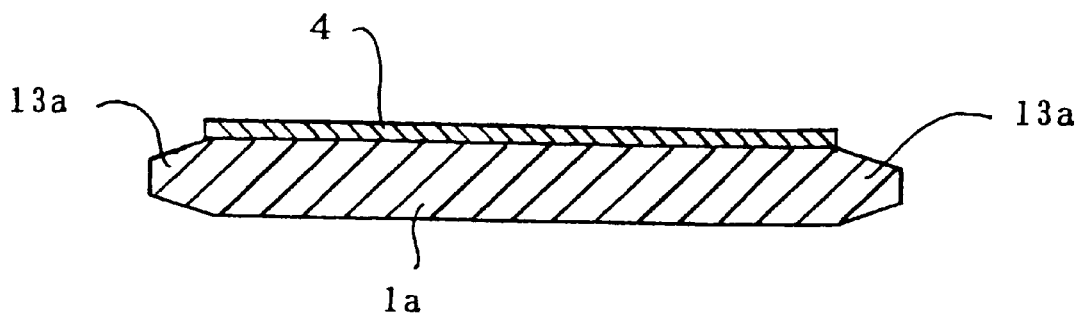
Figure 3:
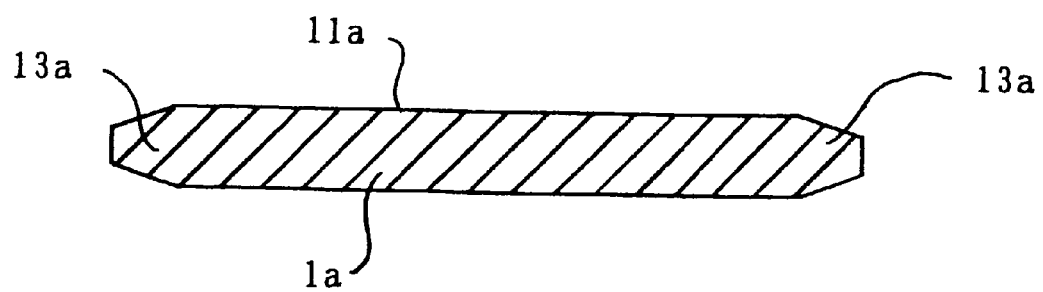

FIGS. 3a, 3b and 3c are crossed-sectional views showing the contours of a semiconductor wafer being treated at different stages according to this embodiment.

As shown in FIG. 3a, before proceeding spin-etching operation, an etching-protection film 4 is formed on the front surface 11a of a polished semiconductor wafer 1a. It is preferable that the etching-protection film 4 is that capable of enduring erosion of the etchant, such as a resist film, an oxide film, or an acidproof seal.

Similar to that shown in Embodiment 1, etchant is supplied onto the front surface 11a of the polished semiconductor wafer 1a which has the etching-protection film 4 formed thereon. As shown in FIG. 3b, the etching-protection film 4 is not etched by the etchant, only the beveled portion 13a is etched and mirror-finished.

As shown in FIG. 3c, the etching-protection film 4 is removed from the front surface 11a of the semiconductor mirror wafer 1a whose beveled portion 13a has been etched solely.

DATA MEASURED

The processing times and surface roughness of the products are compared between the products which are respectively treated by a conventional polishing process and the spin-etching process according to this invention are as follows. The result is as follows.

The peripheral portion of a semiconductor wafer can be beveled and ground by a beveling device (the grinding wheel number is resin #1500) into a surface roughness (Ra) about 700 Å (rms value obtained by optical type measurement equipment). A conventional polishing unit can further finish the beveled portion into a surface roughness (Ra) about 100 Å. The time required for the above mirror-finishing is about 7 min/piece.

On the other hand, the surface roughness (Ra) of the beveled portion can reach a value of about or less than 100 Å by employing the spin-etching of this invention. Moreover, the time required for mirror-finishing the beveled portion into a surface roughness (Ra) about or less than 100 Å is 2 min/piece, therefore the processing time is notably shortened.

What is claimed is:

1. A method for manufacturing semiconductor wafers comprising a process of mirror-finishing the beveled portions formed on the outer peripheries of the semiconductor wafers;

the beveled portions formed on the outer peripheries of the semiconductor wafers being mirror-finished by spin-etching operation.

2. A method for manufacturing semiconductor wafers comprising a process of spin-etching a front surfaces of the semiconductor wafers, wherein a process of mirror-finishing a beveled portions formed of the outer peripheries of said semiconductor wafer is performed while etching the front surfaces of the semiconductor wafers.

3. A method for manufacturing semiconductor wafers comprising a process of spin-etching the semiconductor wafer front surfaces while supporting the rear surfaces of the semiconductor wafers, wherein the spin-etching process is adjusted so that the etchant supplied onto the front surface of the semiconductor wafers spreads over to reach the boundaries between the beveled portions formed on the outer peripheries and the rear surfaces of the semiconductor wafers.

4. A method for manufacturing semiconductor wafers according to claim 2, wherein an etching-protection film is formed to cover the front surface of the semiconductor wafer before spin-etching the semiconductor wafer, and the etching-protection film is removed after the spin-etching operation.

5. A method for manufacturing semiconductor wafers according to claim 3, wherein an etching-protection film is formed to cover the front surface of the semiconductor wafer before spin-etching the semiconductor wafer, and the etching-protection film is removed after the spin-etching operation.

6. A method for manufacturing semiconductor wafers, comprising a process of mirror-finishing the beveled portions formed on the outer peripheries and a front surfaces of the semiconductor wafers with etchant, wherein while the rear surfaces of semiconductor wafers are chucked and rotated, the etchant is supplied onto the front surfaces of the semiconductor wafers to spreads over the front surfaces and turns around on the beveled portions of the semiconductor wafers, at the same time gas is guided to flow in the centrifugal direction along the rear surfaces so as to blow off the etchant having exceeded the boundaries between the beveled portions formed on the outer peripheries and the rear surfaces of the semiconductor wafers.

\* \* \* \* \*